United States Patent
Orcutt et al.

(10) Patent No.: US 10,418,540 B2
(45) Date of Patent: Sep. 17, 2019

(54) ADJUSTMENT OF QUBIT FREQUENCY THROUGH ANNEALING

(71) Applicant: INTERNATIONAL BUSINESS MACHINES CORPORATION, Armonk, NY (US)

(72) Inventors: Jason S. Orcutt, Katonah, NY (US); Sami Rosenblatt, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/824,438

(22) Filed: Nov. 28, 2017

(65) Prior Publication Data

US 2019/0165243 A1 May 30, 2019

(51) Int. Cl.
| | |
|---|---|
| *H01L 39/24* | (2006.01) |
| *G02B 6/35* | (2006.01) |
| *G02B 6/34* | (2006.01) |

(52) U.S. Cl.
CPC .............. *H01L 39/249* (2013.01); *G02B 6/34* (2013.01); *G02B 6/354* (2013.01); *H01L 39/2493* (2013.01)

(58) Field of Classification Search
None
See application file for complete search history.

(56) References Cited

U.S. PATENT DOCUMENTS

| | | | |
|---|---|---|---|
| 4,163,156 A | 7/1979 | Daetwyler et al. | |
| 4,220,959 A | 9/1980 | Kroger | |
| 4,490,901 A | 1/1985 | Clark et al. | |
| 4,535,219 A | 8/1985 | Sliwa, Jr. | |
| 6,218,214 B1 | 4/2001 | Panchou et al. | |
| 6,232,212 B1 | 5/2001 | Degani et al. | |
| 6,495,915 B1 | 12/2002 | Hsieh et al. | |
| 6,630,723 B2 | 10/2003 | Hedler et al. | |
| 7,002,166 B2 | 2/2006 | Jamieson et al. | |
| 7,122,837 B2 | 10/2006 | Linares et al. | |
| 7,176,066 B2 | 2/2007 | Brenner et al. | |

(Continued)

FOREIGN PATENT DOCUMENTS

| | | |
|---|---|---|
| DE | 102009033566 A1 | 1/2011 |
| EP | 2202545 A1 | 6/2010 |

(Continued)

OTHER PUBLICATIONS

Granata et al., "Trimming of Critical Current in Niobium Josephson Devices by Laser Annealing", 8th European Conference on Applied Superconductivity (EUCAS 2007), Journal of Physics: Conferences Series 97 (2008), Copyright 2008, 6 Pages, IOP Publishing.

(Continued)

*Primary Examiner* — Bradley Smith

(74) *Attorney, Agent, or Firm* — L. Jeffrey Kelly

(57) ABSTRACT

An embodiment includes a method and device for forming a multi-qubit chip. The method includes forming a plurality of qubits on a chip, where each qubit comprises a Josephson junction. The method includes annealing one or more Josephson junctions. Annealing is performed by one or more of a plurality of laser emission sources on a planar lightwave circuit. Each of the laser emission sources is located above each qubit.

13 Claims, 10 Drawing Sheets

(56) References Cited

U.S. PATENT DOCUMENTS

| | | | |
|---|---|---|---|
| 7,343,059 | B2 | 3/2008 | Beausoleil et al. |
| 7,394,268 | B2 | 7/2008 | Bertin et al. |
| 7,411,187 | B2 | 8/2008 | Monroe et al. |
| 7,466,725 | B2 | 12/2008 | Ichimura et al. |
| 7,679,166 | B2 | 3/2010 | Anderson et al. |
| 7,899,092 | B2 | 3/2011 | Malinovsky |
| 7,977,668 | B2 | 7/2011 | Nevirkovets et al. |
| 8,054,072 | B2 | 11/2011 | Ichimura et al. |
| 8,111,083 | B1 | 2/2012 | Pesetski et al. |
| 8,148,715 | B2 | 4/2012 | Hollenberg et al. |
| 8,329,556 | B2 | 12/2012 | Yuan et al. |
| 8,440,471 | B2 | 5/2013 | Ranjan et al. |
| 8,816,325 | B2 | 8/2014 | Schenkel et al. |
| 9,054,298 | B2 | 6/2015 | Zhou et al. |
| 9,082,637 | B2 | 7/2015 | Taylor |
| 9,208,280 | B2 | 12/2015 | Bocharov et al. |
| 9,350,460 | B2 * | 5/2016 | Paik .................. H04B 10/70 |
| 9,355,362 | B2 * | 5/2016 | Shea .................. H01L 39/223 |
| 9,443,200 | B2 | 9/2016 | Schroff |
| 9,524,470 | B1 | 12/2016 | Chow et al. |
| 9,599,904 | B2 | 3/2017 | Schubert et al. |
| 9,607,271 | B2 | 3/2017 | Papile |
| 9,647,662 | B1 | 5/2017 | Abutaleb et al. |
| 9,858,531 | B1 * | 1/2018 | Monroe .............. G06N 99/002 |
| 10,134,972 | B2 | 11/2018 | Oliver et al. |
| 2002/0074544 | A1 | 6/2002 | Sung et al. |
| 2003/0193097 | A1 | 10/2003 | Il'ichev et al. |
| 2005/0074220 | A1 | 4/2005 | Rey |
| 2005/0170572 | A1 | 8/2005 | Hongo et al. |
| 2007/0272669 | A1 | 11/2007 | Comley et al. |
| 2008/0258049 | A1 | 10/2008 | Kuzmich et al. |
| 2009/0057652 | A1 | 3/2009 | Nevirkovets et al. |
| 2013/0003188 | A1 | 1/2013 | Andreasch et al. |
| 2013/0029848 | A1 | 1/2013 | Gonzalez |
| 2013/0119351 | A1 | 5/2013 | Shea et al. |
| 2014/0328116 | A1 | 11/2014 | Guo |
| 2015/0021726 | A1 | 1/2015 | Min et al. |
| 2015/0310350 | A1 | 10/2015 | Niskanen et al. |
| 2015/0316598 | A1 | 11/2015 | Rogge et al. |
| 2016/0292586 | A1 | 10/2016 | Rigetti et al. |
| 2016/0321558 | A1 | 11/2016 | Nakamura et al. |
| 2016/0343934 | A1 | 11/2016 | Chang et al. |
| 2016/0344414 | A1 | 11/2016 | Naaman et al. |
| 2017/0001900 | A1 | 1/2017 | Marjanovic et al. |
| 2017/0059964 | A1 | 3/2017 | Nakamura et al. |
| 2017/0072504 | A1 | 3/2017 | Abraham et al. |
| 2017/0076787 | A1 | 3/2017 | Frank |
| 2017/0077382 | A1 | 3/2017 | Abraham et al. |
| 2017/0177534 | A1 | 6/2017 | Mohseni et al. |
| 2018/0012932 | A1 | 1/2018 | Oliver et al. |
| 2018/0102469 | A1 | 4/2018 | Das et al. |
| 2018/0102470 | A1 | 4/2018 | Das et al. |

FOREIGN PATENT DOCUMENTS

| | | |
|---|---|---|
| JP | 3198655 B2 | 8/2001 |
| JP | 2007193778 A | 8/2007 |
| WO | 9822985 A2 | 5/1998 |
| WO | 2017075246 A1 | 5/2017 |
| WO | 2017105524 A1 | 6/2017 |
| WO | 2017131831 A2 | 8/2017 |

OTHER PUBLICATIONS

Hadden et al., "Waveguide-coupled single NV in diamond enabled by femtosecond laser writing", Apr. 7, 2010, 5 Pages, Institute for Quantum Science and Technology, University of Calgary, Calgary, Canada.

Knoernschild et al., "Independent individual addressing of multiple neutral atom qubits with a micromirror-based beam steering system", Applied Physics Letters 97, Sep. 2010, 3 Pages, Copyright 2010 American Institute of Physics.

Mehta et al., "Integrated Optical Adressing of an ion quibit", Nature Nanotechnology, Dec. 2016, pp. 1066-1070, Copyright 2016 Macmillan Publishers Limited, Department of Electrical Engineering & Computer Science and Research Laboratory of Electronics, Massachusetts Institute of Technology, Cambridge, MA.

Wale, "Self Aligned, Flip Chip Assembly of Photonic Devices with Electrical and Optical Connections", Electronic Components and Technology Conference, 1990, IEEE, 8 pages.

Lee et al., "3D Stacked Flip Chip Packaging with Through Silicon Vias and Copper Plating or Conductive Adhesive Filling", 2005 Electronic Components and Technology Conference, Copyright 2005 IEEE, 7 pages.

Rodin et al., "High Throughput Low CoO Industrial Laser Drilling Tool", Research Gate, Center for Physical Sciences and Technology, Jul. 2008, 7 pages.

Duocastella et al., "Bessel and annual beams for materials processing," Laser Photonics Rev. 6, No. 5, 607-621 (2012), DOI 10.1002/lpor.201100031.

Chen et al. "Qubit architecture with high coherence and fast tunable coupling." Physical review letters 113.22 (2014): 220502, abstract, 5 pgs.

Gilabert et al., "Photoinduced enhancement of the Josephson effect in YBaCuO grain boundary junctions," Journal of Low Temperature Physics, Feb. 1997, vol. 106, Issue 3, pp. 255-264.

Granata et al., "Induced change of critical current density profile in Nb/Al—AlOx/Nb Josephson junctions," Journal of Physics: Conference Series 507 (2014) 042046, 5 pgs.

Granata et al., "Localized laser trimming of critical current in niobium based Josephson devices," App. Phys. Lett 90, 232503 (2007), doi: 10.1063/1.2746060, 4 pgs.

Granata et al., "Spatial modulation of critical current density in niobium based Josephson junctions induced by selective heating," Appl. Phys. Lett. 00102, 222603 (2013); doi: 10.1063/1.4809737, 5 pgs.

Hutchings et al. "Tunable Superconducting Qubits with Flux-Independent Coherence." arXiv preprint arXiv:1702.02253 (2017), pp. 1-17.

Mount et al., "Single qubit manipulation in a microfabricated surface electrode ion trap," New Journal of Physics, vol. 15, Sep. 2013, 17 pgs.

Shim et al., "Bottom-up superconducting and Josephson junction devices inside a Group-IV semiconductor," Nature Communications, 5, 4225 (2014), arXiv:1309.0015v3, 9 pgs.

Saffman, "Quantum Computing with Atomic Qubits and Rydberg Interactions: Progress and Challenges", Journal of Physics B: Atomic, Molecular and Optical Physics, May 17, 2016, 25 Pages, OP Publishing Ltd., Copyright 2016, UK.

Lagoudakis et al., "Initialization of a spin qubit in a site-controlled nanowire quantum dot", New Journal of Physics, 2016, 8 Pages, Published in a partnership with Deutsche Physlakalsche Gesellschaft and the Institute of Physics, IOP Science, Canada.

Rioux et al., "Linear, annular, and radial focusing with axicons and applications to laser machining", Applied Optics, vol. 17, Issue 10, pp. 1532-1536 (1978), https://doi.org/10.1364/AO.17.001532, Abstract Only.

Orcutt et al., "Laser Annealing Qubits for Optimized Frequency Allocation", U.S. Appl. No. 15/823,728, filed Nov. 28, 2017, 35 Pages.

Rosenblatt et al., "Laser Annealing of Qubits With Structured Illumination", U.S. Appl. No. 15/823,713, filed Nov. 28, 2017, 39 Pages.

Hertzberg et al., "Frequency Tuning of Multi-Qubit Systems", U.S. Appl. No. 15/824,492, filed Nov. 28, 2017, 56 Pages.

Rosenblatt et al., "Flip Chip Integration on Qubit Chips", U.S. Appl. No. 15/823,675, filed Nov. 28, 2017, 33 Pages.

List of IBM Patents or Patent Applications Treated as Related, dated Jan. 8, 2018, 2 pages.

Baek et al., "Thermal stability of Nb/a—NbxSi 1-x/Nb Josephson junctions", Physical Review B 75, 2007, The American Physical Society, pp. 054514-1-054514-6.

Pop et al., "Fabrication of stable and reproducible sub-micron tunnel junctions", May 31, 2011, 4 pages.

(56) References Cited

OTHER PUBLICATIONS

Pavolotsky et al., "Aging- and annealing-induced variations in Nb/Al—AlOx/Nb tunnel junction properties", Journal of Applied Physics 109, 2011, pp. 024502-1-024502-5.
IBM: List of IBM Patents or Patent Applications Treated As Related (Appendix P), Jan. 28, 2019, 2 pages.
International Search Report and Written Opinion, International Application No. PCT/EP2018/080736, IBM Docket P201701347PCT01, 10 pgs., Mar. 6, 2019.
Pending U.S. Appl. No. 16/183,376, filed Nov. 7, 2018, entitled: "Laser Annealing of Qubits With Structured Illumination", 39 pages.
Notification of Transmittal of The International Search Report and The Written Opinion of The International Searching Authority, or The Declaration, dated Jan. 30, 2019, International application No. PCT/EP2018/080735, 16 pages.
Braslau et al, "Fabrication of Planar Josephson Junctions by Laser Irradiation", An IP.com Prior Art Database Technical Disclosure, Original Publication Date: Apr. 1, 1976, IP.com Number: IPCOM000085574D, IP.com Electronic Publication Date: Mar. 2, 2005, 2 pages.
Pending U.S. Appl. No. 16/251,569, filed Jan. 18, 2019, entitled: "Flip Chip Integration on QUBIT Chips", 33 pages.
Kamal et al., "Improved superconducting qubit coherence with high-temperature substrate annealing", arXiv:1606.09262v1 [cond-mat.mes-hall] Jun. 29, 2016, pp. 1-10.

\* cited by examiner

ADJUSTMENT OF QUBIT FREQUENCY THROUGH ANNEALING

BACKGROUND

The present disclosure relates generally to the field of qubit manufacturing for quantum computing, and more specifically to programming the frequency of a qubit post fabrication.

In quantum computing, a qubit or quantum bit is a unit of quantum information—the quantum analogue of the classical bit. A qubit is a two-state quantum-mechanical system. In a classical system, a bit would have to be in one state or the other. However, quantum mechanics allows the qubit to be in a superposition of both states at the same time, a property that is fundamental to quantum computing.

A Mach-Zehnder switch is an electro-optic 2×2 switch based on an integrated Mach-Zehnder interferometer. The switching between the ports is achieved by an electro-optic effect within such structure. Voltage, applied to the electrodes deposited on the integrated Mach-Zehnder interferometer, creates an electric field distribution within the substrate, which consequently changes its refractive index. If properly designed, the induced change in the refractive index leads to different coupling between individual ports.

SUMMARY

An embodiment includes a method and device for forming a multi-qubit chip. The method includes forming a plurality of qubits on a chip, where each qubit comprises a Josephson junction. The method includes annealing one or more Josephson junctions. Annealing is performed by one or more of a plurality of laser discharge structures on a planar lightwave circuit. Each of the laser discharge structures is located above each qubit.

BRIEF DESCRIPTION OF THE DRAWINGS

The drawings included in the present disclosure are incorporated into, and form part of, the specification. They illustrate embodiments of the present disclosure and, along with the description, serve to explain the principles of the disclosure. The drawings are only illustrative of certain embodiments and do not limit the disclosure.

Figure 1:
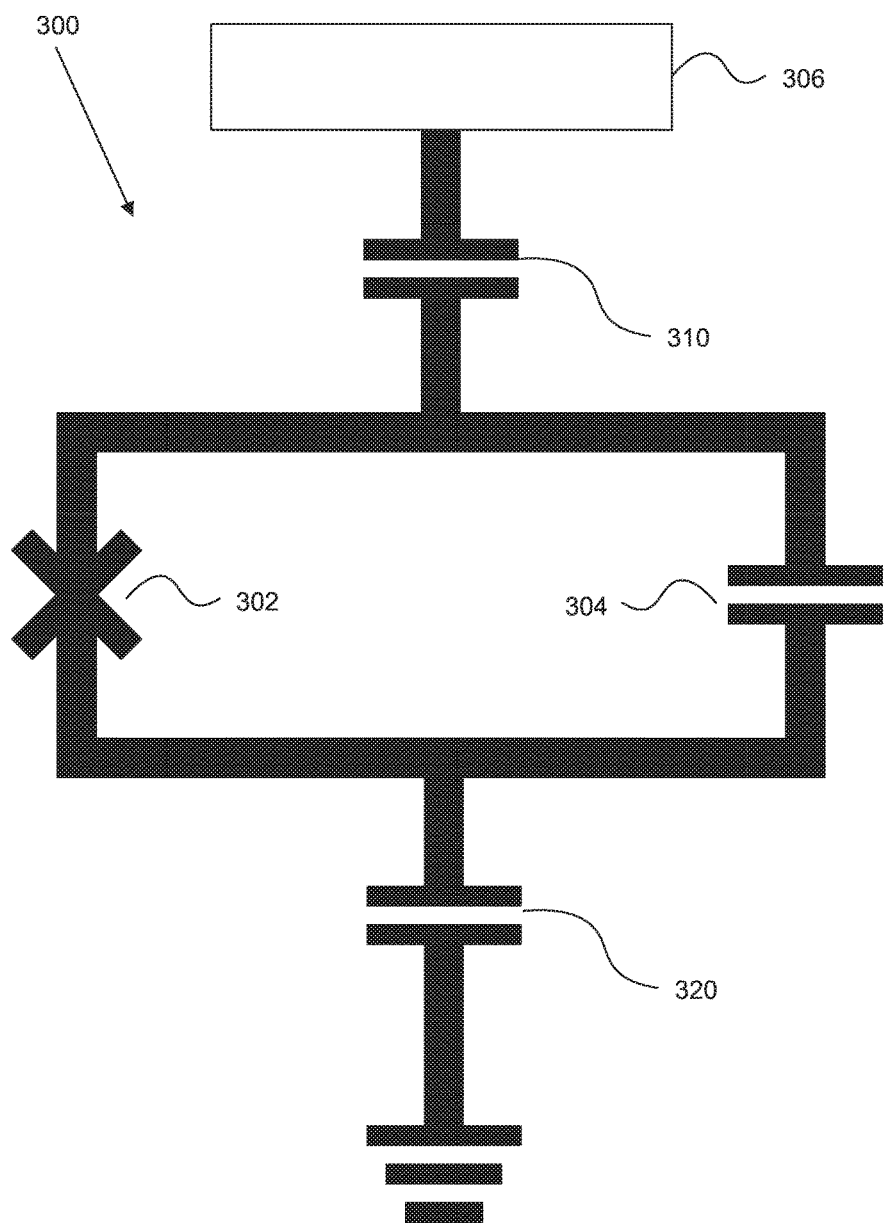
FIG. 1 illustrates an example qubit circuit diagram, in accordance with embodiments of the invention.

Elements of the figures are not necessarily to scale and are not intended to portray specific parameters of the invention. For clarity and ease of illustration, dimensions of elements may be exaggerated. The detailed description should be consulted for accurate dimensions. The drawings are intended to depict only typical embodiments of the invention, and therefore should not be considered as limiting the scope of the invention. In the drawings, like numbering represents like elements.

DETAILED DESCRIPTION

Example embodiments now will be described more fully herein with reference to the accompanying drawings, in which example embodiments are shown. This disclosure may, however, be embodied in many different forms and should not be construed as limited to the example embodiments set forth herein. Rather, these example embodiments are provided so that this disclosure will be thorough and complete and will convey the scope of this disclosure to those skilled in the art. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements. The term substantially, or substantially similar, refer to instances in which the difference in length, height, or orientation convey no practical difference between the definite recitation (e.g. the phrase sans the substantially similar term), and the substantially similar variations. In one embodiment, substantial (and its derivatives) denote a difference by a generally accepted engineering or manufacturing tolerance for similar devices, up to, for example, 10% deviation in value or 10° deviation in angle.

In the interest of not obscuring the presentation of embodiments of the present invention, in the following detailed description, some processing steps or operations that are known in the art may have been combined together for presentation and for illustration purposes and in some instances, may have not been described in detail. In other instances, some processing steps or operations that are known in the art may not be described at all. It should be understood that the following description is rather focused on the distinctive features or elements of various embodiments of the present invention.

Multi-qubit chips are employed in creating quantum computing systems. However, each additional qubit added to a chip adds to the design complexity of the chip, as a qubit may have quantum interactions with other proximate qubits, based on their resonance frequency. Such behavior constitutes a failure mode known as a "frequency collision." Frequency collisions can be predicted by modeling of the quantum-mechanical system. A non-limiting example of frequency collision happens when the resonance frequency of two proximate qubits are similar (e.g., when the frequency of one qubit equals the frequency of another qubit). In order to achieve high performance, it is desirable to be able to set the frequency of each qubit very precisely. Traditionally, adjustable magnetic fields have been used to shift the frequency of qubits, but the necessary tuning circuits tend to introduce noise and add extra complexity within a multi-qubit system.

In example embodiments of the present invention, the qubit includes the following properties: during measurement, the qubit is projected into one of two different states (IA) or IB)). Read-out occurs while the two states IA) and IB) are stable, after which the qubit decoheres. The readout resonator attains a resonance frequency based upon the state of the projected qubit.

The projected state of the qubit can be inferred based on the readout resonator frequency, which can be determined based on the reflection or transmission coefficient of the readout resonator. This can be accomplished through various techniques. In an example technique, a microwave signal is applied to the input of the circuit and is tuned to a frequency approximately equal to the resonance frequency of one of the post measurement quasi-stable states in accordance with one example embodiment. When the qubit is projected into the measured state, the applied microwave signal either transmits to the output or is reflected by the readout resonator, depending on the coupling of the qubit to the transmission lines. Therefore, depending on the qubit state, the microwave signal will acquire a specific magnitude and phase. The determination of the qubit state from this signal can be done in a variety of ways, for example, using IQ mixers, threshold detectors and so forth. Other various methods for measuring frequency or state may be used as well.

In some cases, additional amplifiers such as SQUID amplifiers or HEMT amplifiers may be required as well as room temperature microwave electronics such as IQ mixers, and so forth.

Referring now to FIG. 1, illustrated is a qubit 300, in accordance with embodiments of the present invention. In some embodiments, the qubit 300 contains a Josephson junction 302 and a capacitor 304 connected in parallel with one another, as shown in FIG. 1. The parallel Josephson junction 302 and capacitor 304 arrangement is capacitively coupled by a coupling capacitor 310 to structure 306, as well as capacitively coupled by a coupling capacitor 320 to ground. While only a single structure is shown capacitively coupled to the Josephson junction 302 and capacitor 304, multiple structures may be attached to the parallel Josephson junction 302 and capacitor 304 arrangement depicted. For example, a readout structure and interconnects to other qubit structures may each be capacitively connected to the parallel Josephson junction 302 and capacitor 304 arrangement. Additionally, while qubit 300 is depicted as using coupling capacitor 310 and coupling capacitor 320, other methods of electrically connecting the qubit may be used. In accordance with one example embodiment, the capacitor 304 is in the range of 0.1 femtofarads (fF) to 200 femtofarads (fF). In accordance with one example embodiment, the Josephson junction 302 has an effective critical current ranging approximately from 10 to 100 nanoamperes. The critical current is related to the overall resistance of the Josephson junction, prior to achieving a superconducting state as predicted by the Ambegaokar-Baratoff relation. More specifically, the relation predicts that the resistance of the Josephson junction prior to achieving the superconducting state is inversely proportional to the critical current after turning superconducting. Furthermore, this critical current is also inversely proportional to the inductance of the Josephson junction.

As a result, the resonance frequencies of the qubit range approximately between a few hundred MHz up to about 20 GHz. The coupling capacitor 310 of the qubit can be engineered for high fidelity readout. The qubit described in this example embodiment is also known as a single-junction transmon qubit. Such a qubit is not susceptible to tuning using a magnetic field and its resonance frequency is therefore fixed by the parameters of the capacitor and junction formed at the time of fabrication. Other embodiments may utilize a qubit of another type (e.g., a phase qubit, a charge qubit). In other embodiments, two or more Josephson junctions arranged as series or parallel circuit elements may substitute for the single Josephson junction 302 depicted in FIG. 1.

Figure 2:
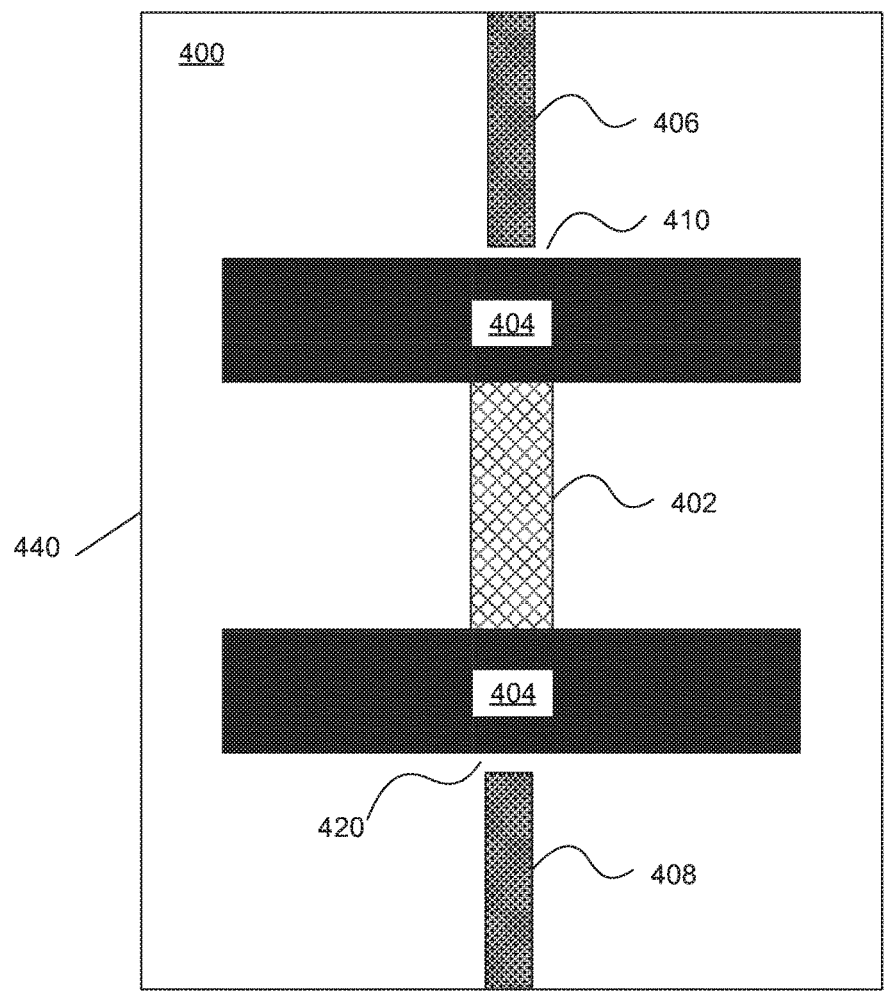
FIG. 2 illustrates a top view of an example qubit formed on a substrate, in accordance with embodiments of the invention.

Referring now to FIG. 2, illustrated is an example layout of an embodiment of the capacitively coupled qubit depicted in FIG. 1 following fabrication on substrate 400, in accordance with embodiments of the present invention. Fabrication of Josephson junction 402 may proceed by, for example, (1) subtractive patterning of a trilayer (superconductor(s)-insulator-superconductor(s)) material stack or (2) the Dolan bridge technique. The Dolan Bridge technique is described herein as an illustrative example. In such technique, the Josephson junction 402 is patterned between capacitive plates 404, which may be capacitively coupled, via capacitor 410, to line 406, and capacitively coupled to ground line 408, via capacitor 420, all located on substrate 400. While only a single line 406 is depicted, multiple lines may be communicatively coupled to capacitive plates 404, thus capacitively connecting qubit 440 to a plurality of structures.

In the example embodiment depicted in FIG. 2, the substrate 400 on which the qubit circuit is formed can be high resistivity (intrinsic) eight-inch silicon wafers. A bilayer of resist is spun on the wafers, such as a copolymer methyl methacrylate (MMA) layer and a subsequent thinner layer of polymethyl methacrylate (PMMA). Using electron-beam lithography, a pattern for the Josephson junction 402 is written into the resist. This step is followed by development in an MIBK:IPA (Methyl Isobutyl Ketone (MIBK) Isopropyl alcohol (IPA)) (1:3) solution for about one minute, which removes areas of the resist exposed to the electron beam. The MMA layer is more sensitive to the electron beam, which creates areas of undercut PMMA. As such, a suspended bridge out of the PMMA, also called a Dolan bridge, can be made with no MMA beneath. The sample is placed in an e-beam evaporator where Al is evaporated at two angles with oxidation (in an $Ar/O_2$ atmosphere) between Al evaporations. The junction is formed in the overlap area.

The remaining resist and unwanted metal is removed by placing the sample in acetone. Using this lift-off technique, junction areas can be made ranging from 0.01 μm² to 1 μm². This basic fabrication process can be used with other extra fabrication steps such as PECVD, optical lithography, and RIE to make other devices. In example embodiments, the Josephson junction 402 is fabricated on a silicon (Si) substrate using aluminum as a starting compound to form an Al/AlO$_x$/Al structure. In an example embodiment, the substrate 400 is selected to reduce dielectric loss tangent at low temperatures. The substrate 400 may also be selected to be a material which can be etched selectively to the superconducting and dielectric material to be used for the Josephson junction 402. For example, high resistivity Si wafers may be implemented.

In the example embodiment depicted in FIG. 2, capacitive plates 404 may comprise superconducting materials such as, for example, Nb, NbN, NbCN, NbTiN, and Pb. In an example embodiment, capacitive plates 404 may be about 1 to 100 micrometer apart. In an example embodiment, capacitive plates 404 may have a width of about 5 to about 500 micrometers, a length of about 1 to about 200 micrometers, and a height of about 10 to about 500 nanometers from the surface of substrate 400.

Figure 3A:
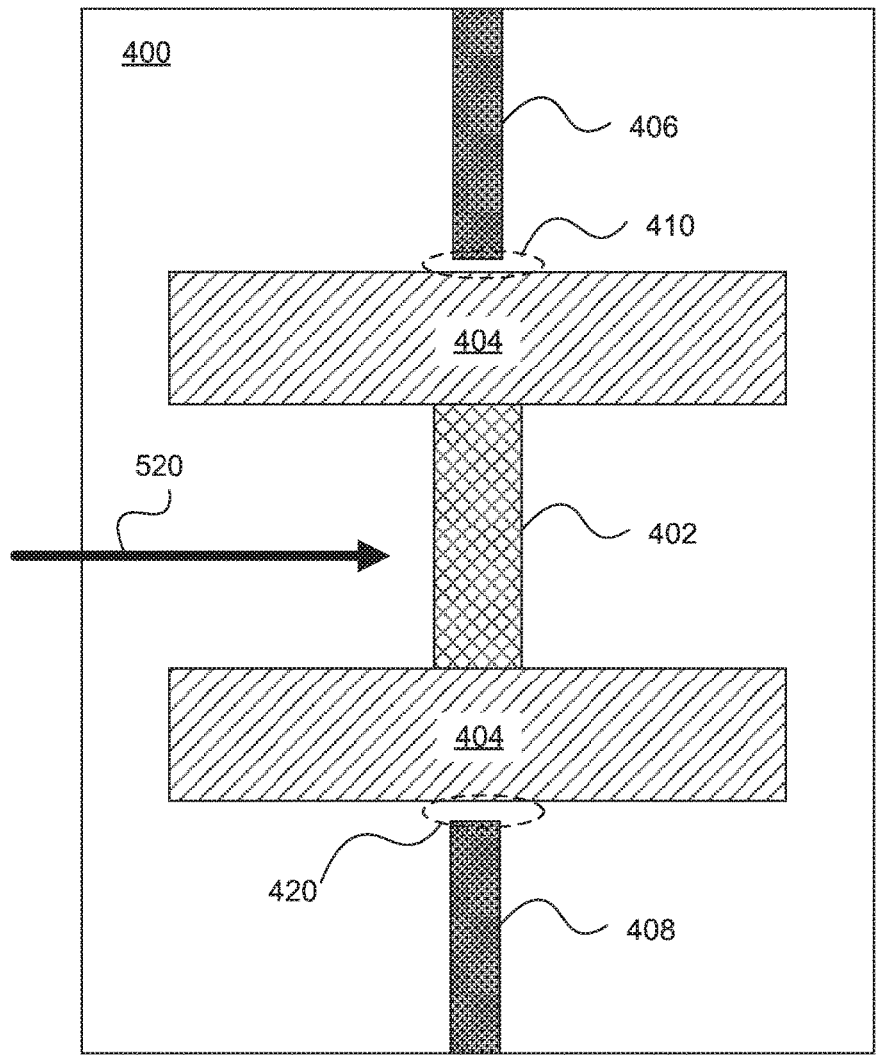
FIG. 3A illustrates a top view of an example chip with a qubit undergoing a laser anneal, in accordance with embodiments of the invention.

Referring to FIG. 3A, the qubit may be annealed to adjust the resistance of the Josephson junction 402 in order to adjust the frequency of the qubit. Annealing of the Josephson junction 402 may include heating the Josephson junction 402 to allow for a physical change to occur within the Josephson junction 402 that results in a change in the resistance. In annealing of the Josephson junction 402, annealing below a threshold dose may result in an increase in the resistance of the Josephson junction 402, while annealing above that threshold may decrease the resistance of the Josephson junction 402. In an embodiment, annealing of the Josephson junction 402 may be done by laser annealing, via thermal source 520, which may enable localized heating to the Josephson junction 402. In an example embodiment, laser annealing may be performed using a doubled Nd:YAG source, emitting a laser having a 532 nm wavelength, however various other wavelengths of light may be used or tested to determine an optimal path to shift the frequency of the qubit. In the example embodiment, a threshold dose may be about 1.4 W for 10 seconds. Thus, in the example embodiment, annealing the Josephson junction 402 at doses below 1.4 W for 10 seconds would lead to an increase in resistance, while annealing at doses above 1.4 W for 10 seconds would lead to a decrease in resistance. In the example embodiment, the frequency shift achieved is based on the power, light frequency and duration of the anneal.

Figure 3B:
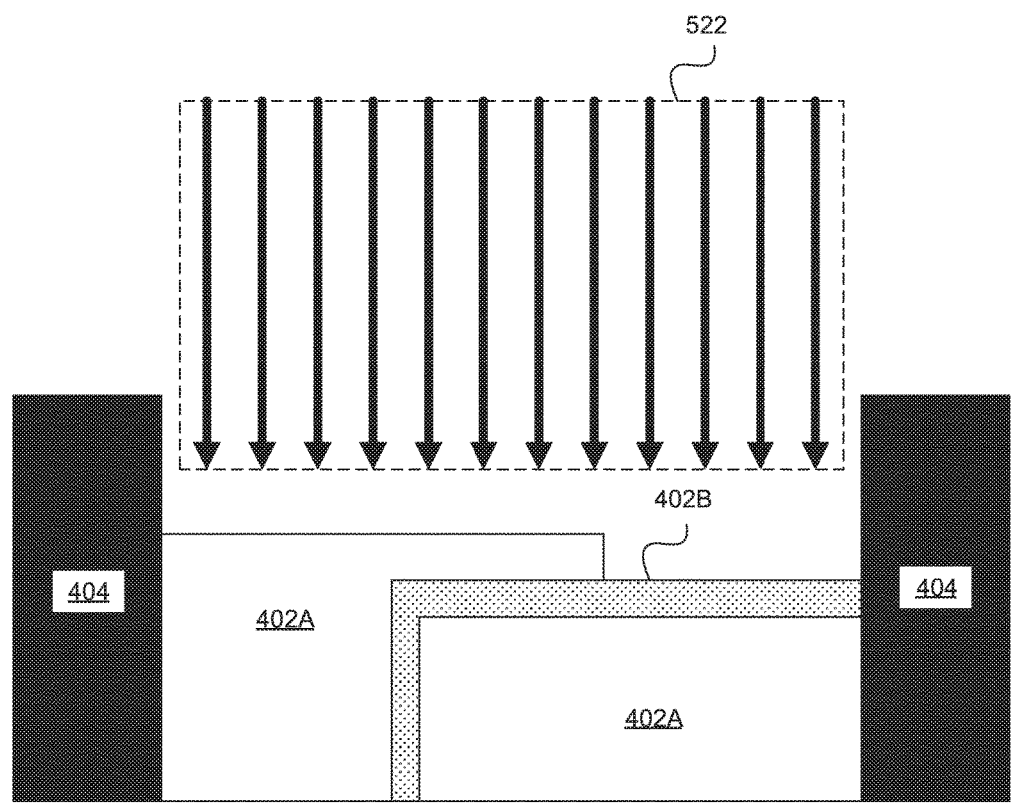
FIG. 3B illustrates a cross-sectional view of the example chip with a qubit undergoing a laser anneal of FIG. 3A, in accordance with embodiments of the invention.

Referring to FIG. 3B, an annealing pattern 522 of laser annealing Josephson junction 402 is depicted. FIG. 3B depicts a cross-sectional view of the chip of FIG. 3A, where Josephson junction 402 is depicted as its constituent layers, aluminum layers 402A and aluminum oxide layer 402B. In such embodiments, aluminum oxide layer 402B may be between 0.1 and 10 nm thick, which may allow quantum tunneling to occur between aluminum layers 402A. As should be understood, the arrangement depicted in FIG. 3B is an example arrangement of the Josephson junction 402, and other geometries may be used.

Still referring to FIG. 3B, annealing pattern 522 may be any pattern capable of changing the resistance of the Josephson junction 402 (FIG. 3A). In an example embodiment, the annealing pattern 522 may cover the entirety of aluminum layers 402A, as well as aluminum oxide layer 402B. In an example embodiment, the annealing pattern 522 may be focused such that it does not hit capacitive plates 404, and thus only localized annealing of the Josephson junction 402 occurs. The anneal may be performed using an annular beam focused only on Josephson junction 402, without contact onto capacitive plates 404, thereby promoting uniform heating of the Josephson junction 402.

In some embodiments, the annealing pattern 522 may be less than or equal to 10 microns in diameter, which may be the size of the beam spot of the thermal source 520 being applied to the Josephson junction 402 (e.g., a laser beam may have a 10 micron diameter). The annealing pattern 522 may be applied with the thermal source 520 depicted in FIG. 3A in order to decrease or increase the resistance of the Josephson junction 402, which may increase or decrease the frequency of a qubit associated with the Josephson junction 402. In some embodiments, the resistance of the Josephson junction 402 and the frequency of the qubit may have an inverse relationship (e.g., if the resistance of the Josephson junction 402 increases, the frequency of the qubit may decrease, or vice-versa, as long as the capacitance of the qubit is unaffected).

Figure 4:
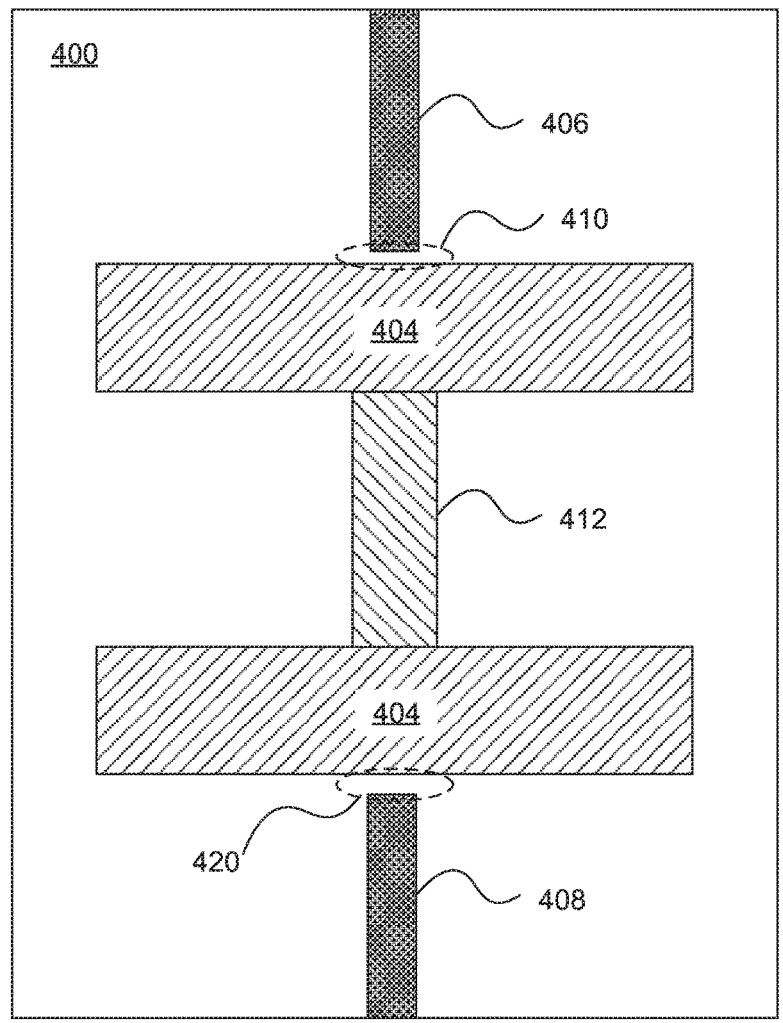
FIG. 4 illustrates a top view of an example qubit after a laser anneal, in accordance with embodiments of the invention.

Referring to FIG. 4, following removal of the thermal source 520, a Josephson junction 412 may result having a different resistance from Josephson junction 402 prior to application of the thermal source 520. In some embodiments, the Josephson junction 412 may be at the second resistance until reapplication of the thermal source 520. The second resistance may differ from the original resistance of Josephson junction 402 based on the time, intensity and frequency of the thermal source 520.

Figure 5:
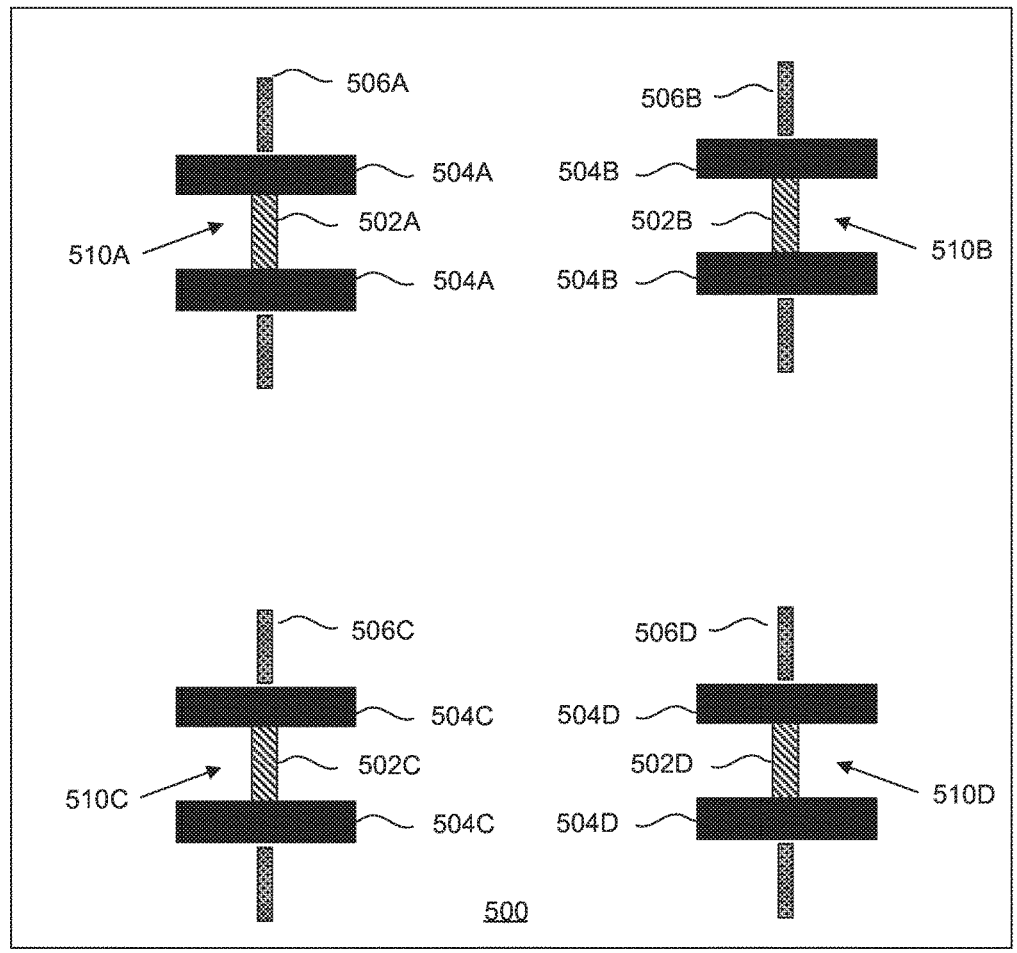
FIG. 5 illustrates a top view of a substrate containing multiple qubits, in accordance with embodiments of the present disclosure.

Referring to FIG. 5, a qubit chip 500 is fabricated. The qubit chip 500 contains qubit 510A, qubit 510B, qubit 510C, and qubit 510D (hereinafter the qubits 510), may be formed on a substrate according to the methods described above, in conjunction with FIG. 2, for forming a qubit 440 on substrate 400. The qubits 510 may be formed concurrently with each other, consecutively or some combination thereof. Each of the qubits contains a Josephson junction 502 (depicted as Josephson junction 502A, Josephson junction 502B, Josephson junction 502C, Josephson junction 502D), capacitive plates 504 (depicted as capacitive plate 504A, capacitive plate 504B, capacitive plate 504C, capacitive plate 504D), and superconducting line 506 (depicted as superconducting line 506A, superconducting line 506B, superconducting line 506C, superconducting line 506D), which relate to Josephson junction 402, capacitive plates 404 and line 406, respectively.

As a result of the fabrication process, for a given set of fabrication conditions the qubits 510 formed may have consistent dimensions (e.g. size and shape of capacitive plates 504, area and thickness of Josephson junction 502). Therefore, the appearance of qubit 510A, qubit 510B, qubit 510C, and qubit 510D may be substantially similar, thereby forming qubits with substantially uniform capacitance across the device. However, in the formation of the Josephson junctions 502, uncontrolled variables at the nanometer scale may introduce a random variation among the resistances of a group of qubits which in all other respects are identical. If the qubits are single-junction transmon qubits, then a +/−2% variation in the resistance of the Josephson junctions 502 will cause a −/+1% variation in the frequencies of the qubits.

Additionally, qubits 510 may be any other structure that requires annealing. For example, qubits 510 may be Josephson junctions between contact pads, which are configured for electrical testing of the resistance of the Josephson junction. By annealing many Josephson junctions on a chip and subsequently measuring the corresponding resistance changes, this information can be used to populate a database of resistance changes (or frequency changes, for qubits) used as input for determining annealing conditions for other junctions (or qubits).

Figure 6A:
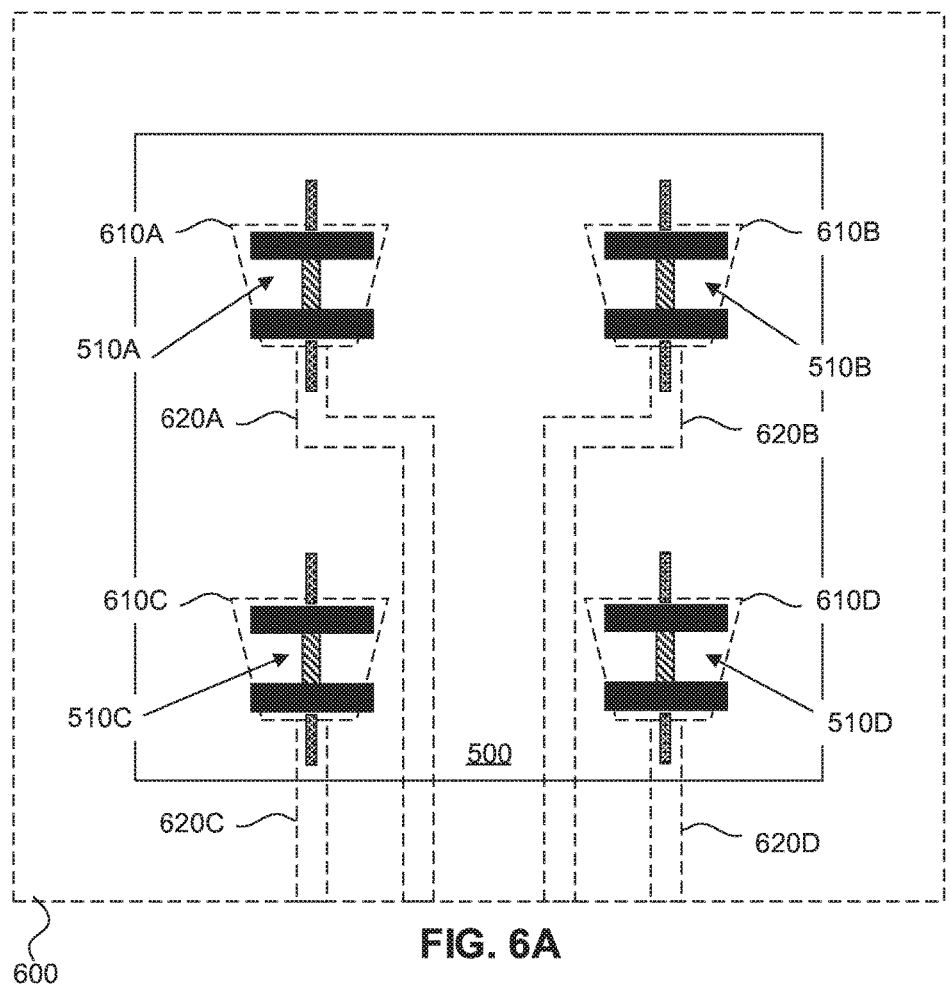
FIG. 6A illustrates a top view of a planar lightwave circuit above the substrate containing multiple qubits, in accordance with embodiments of the invention.
Figure 6B:
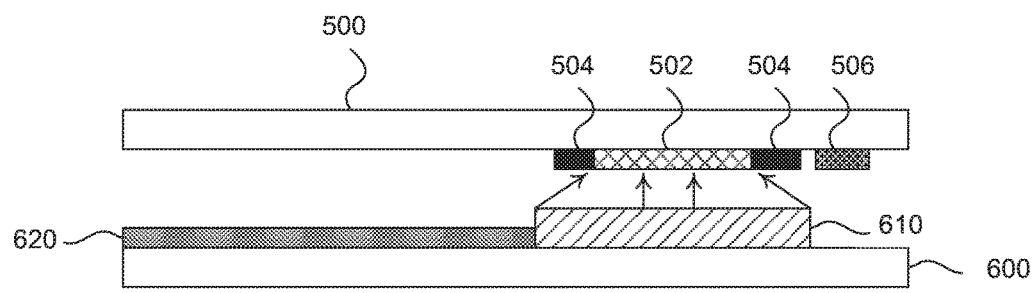
FIG. 6B illustrates a cross-sectional view of annealing of a qubit by a laser discharge structure located on the planar lightwave circuit, in accordance with embodiments of the invention.
Figure 6C:
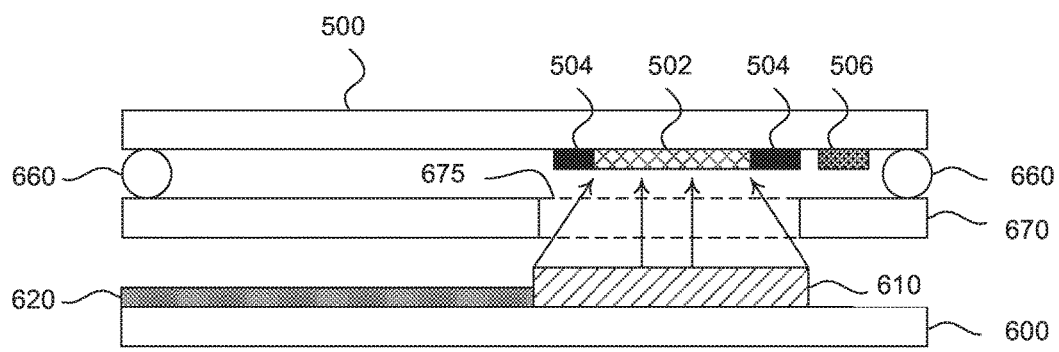
FIG. 6C illustrates a cross-sectional view of an alternative embodiment to FIG. 6B of annealing of a qubit by a laser discharge structure located on planar lightwave circuit through an intermediate chip, in accordance with embodiments of the invention.

Referring to FIG. 6A-6C, annealing of the qubits 510 may be performed using a planar lightwave circuit 600. Referring to FIG. 6A, planar lightwave circuit 600 may contain a plurality of laser discharge structures 610 (depicted as laser discharge structure 610A, laser discharge structure 610B, laser discharge structure 610C, laser discharge structure 610D). Laser discharge structure 610 may be any suitable device capable of providing the required wavelength and intensity to the qubits 510 in order to change the resistance of the Josephson junction 502. Additionally, laser discharge structure 610 may be sized, or capable of focusing, the emitted laser beam only onto the Josephson junction 502. In some embodiments, the laser may be focused into an annular ring in order to provide uniform annealing to the Josephson junction 502. Laser discharge structure 610 may be supplied by optical connection 620 (depicted as optical connection 620A, optical connection 620B, optical connection 620C, optical connection 620D). In an example embodiment, laser discharge structure 610 may be a vertical grating coupler, while optical connection 620 is a fiber optic guide line connecting the vertical grating coupler to a laser. Laser discharge structures 610 may be a Nd:YAG source, emitting a laser having a 532 nm wavelength. Laser discharge structure 610 may be capable of providing a laser emission having a power of about 0.2 W to about 2 W.

Still referring to FIG. 6A, prior to annealing, planar lightwave circuit 600 may be aligned above the qubit chip 500 such that each laser discharge structure 610 is above a qubit 510 (e.g. laser discharge structure 610A is above qubit 510A). In one embodiment, alignment may be accomplished through visual inspection by, for example, determining the location of the qubits and aligning the planar lightwave circuit 600 such that each laser discharge structure 610 is above an associated qubit 150. In another embodiment, alignment may be accomplished by aligning physical markers located on the qubit chip 500 and planar lightwave circuit 600.

Referring to FIG. 6B, laser discharge structure 610 may emit a frequency and intensity of light capable of annealing Josephson junction 502. Laser discharge structures 610 may be a Nd:YAG source, emitting a laser having a 532 nm wavelength.

Referring to FIG. 6C, an intermediate structure 670 may be located between the planar lightwave circuit 600 and the qubit chip 500 during annealing. The intermediate structure may be attached to the qubit chip 500 through mechanical means such as, for example, solder balls 660. Solder balls 660 may additionally act as an electrical connection between conductive wiring located on the qubit chip 500 and conductive wiring located on intermediate structure 670. Additionally, intermediate structure 670 may have a transparent portion 675, which allows the light from discharge structure 610 to pass through to the Josephson junction 502. The transparent portion 675 may be an optically transparent structure, such a sapphire portion of the intermediate structure, or may be a hole in the intermediate structure 670 that allows light to pass through. In some embodiments, planar lightwave circuit 600 may be attached to intermediate structure 670 such that each discharge structure 610 is permanently aligned with each Josephson junction 502.

Figure 7A:
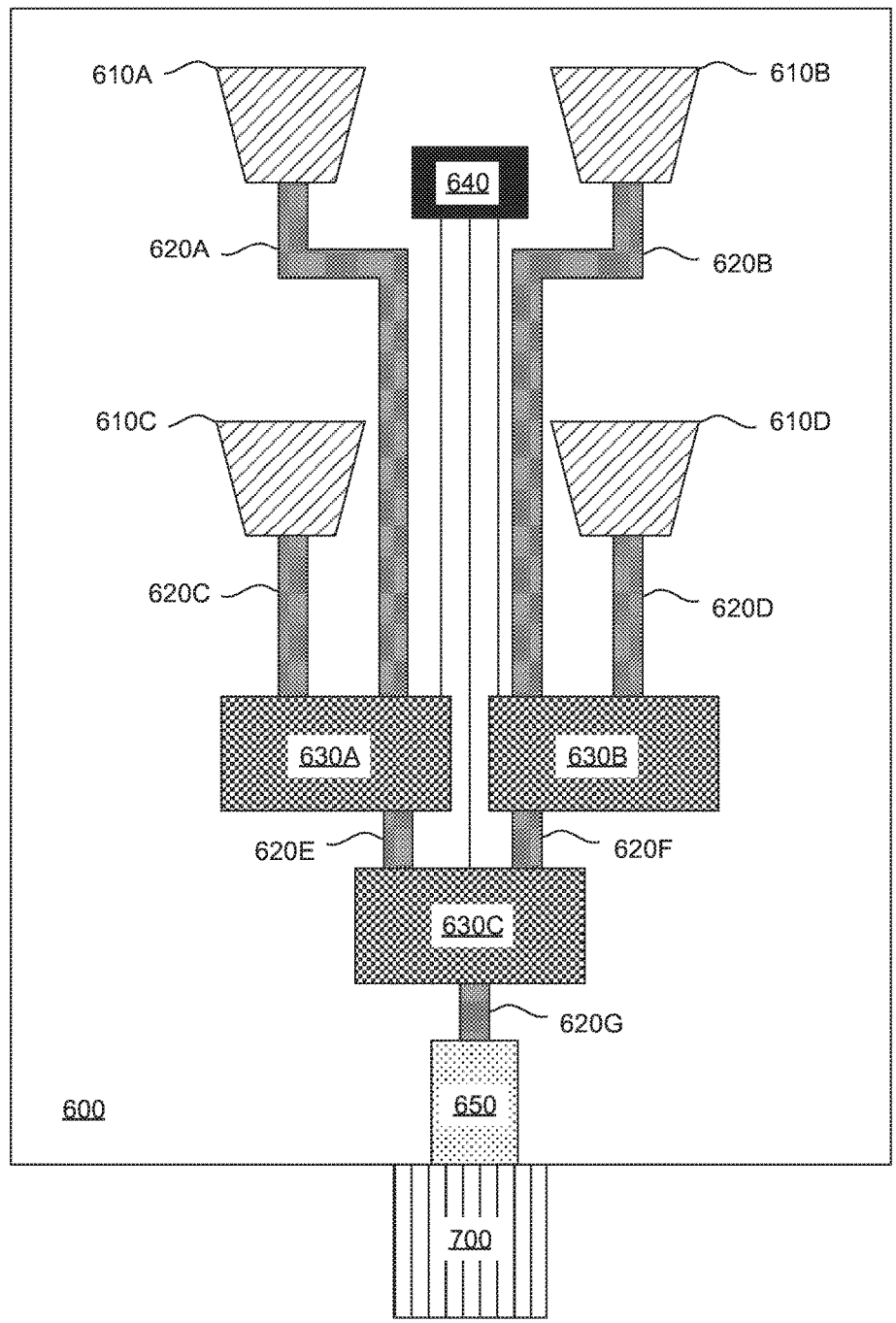
FIG. 7A illustrates a top view of a first layout of laser discharge structures and a routing of light to the discharge structures, in accordance with embodiments of the invention.

Referring to FIG. 7A, an example embodiment of a layout for planar lightwave circuit 600 is depicted. In the example embodiment, a mode converter 650 may receive an optical input from optical fiber 700. The optical input may travel through optical connection 620G to a Mach Zehnder switch 630C. The Mach Zehnder switch 630C may route the optical input to either optical connection 620E and Mach Zehnder switch 630A, or optical connection 620F and Mach Zehnder switch 630B based on the input from Thermal Path Control 640. Further, Thermal Path Control 640 may control the direction the optical input flows through Mach Zehnder switch 630A or Mach Zehnder switch 630B, thereby routing the optical input to laser discharge structure 610A (via optical connection 620A), laser discharge structure 610B (via optical connection 620B), laser discharge structure 610C (via optical connection 620C), or laser discharge structure 610D (via optical connection 620D). In such an embodiment, each discharge structure 610 may individually emit the laser light capable of annealing the Josephson junction 502.

Figure 7B:
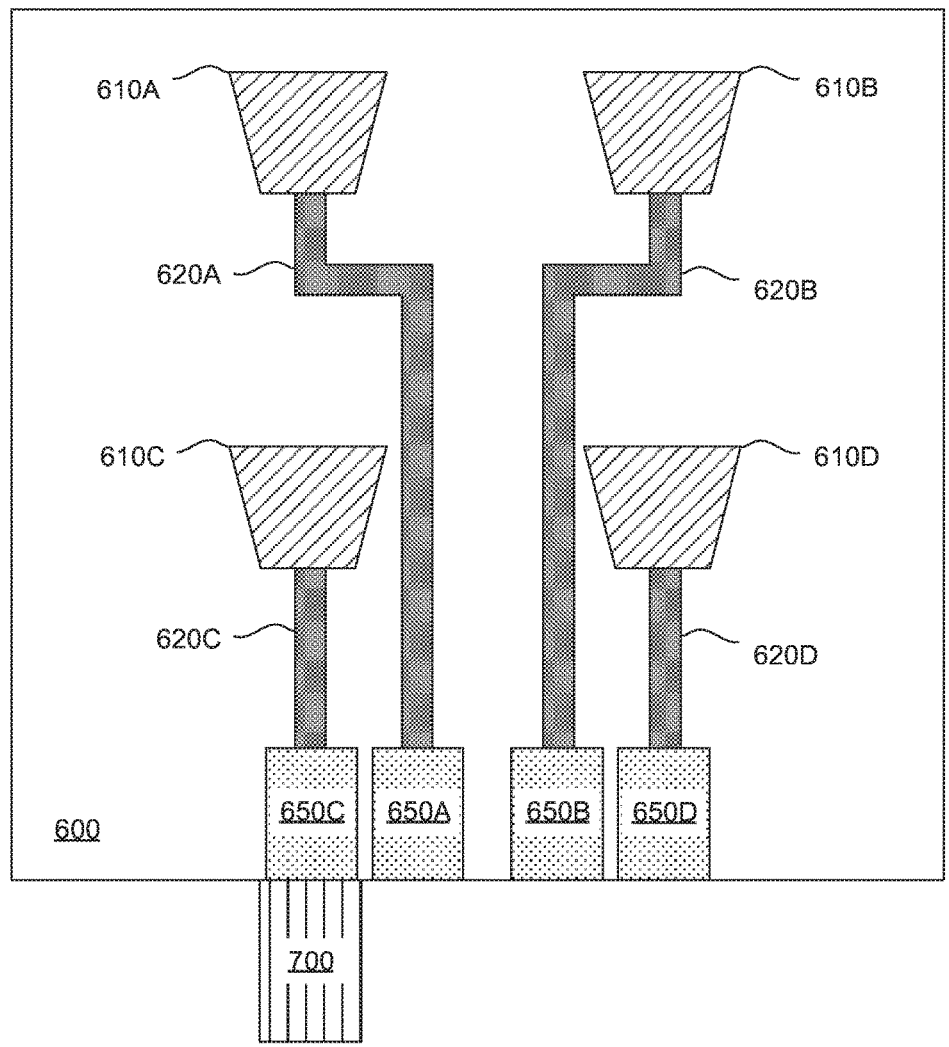
FIG. 7B illustrates a top view of a second layout of laser discharge structures and a routing of light to the discharge structures, in accordance with embodiments of the invention.

Referring to FIG. 7B, another example embodiment of a layout for planar lightwave circuit 600 is depicted. In the example embodiment, a mode converter 650A may receive an optical input from optical fiber 700. The mode converter 650A may provide the optical input to laser discharge structure 610A, via optical connection 620A, thereby annealing the Josephson junction 502 of qubit 510A. Similarly, optical fiber 700 may connect to the optical input to laser discharge structure 610B (via optical connection 620B), laser discharge structure 610C (via optical connection 620C), or laser discharge structure 610D (via optical connection 620D) via mode converter 650B, mode converter 650C, and mode converter 650D, respectively, and annealing of the respective qubits 510 may occur via that routing. Alternatively, multiple optical fibers 700 may be attached to multiple mode converters, thereby allowing for simultaneous annealing of the structures. FIGS. 7A and 7B only show 2 possible layouts, and combinations of the two embodiments are contemplated.

In an example embodiment, a planar lightwave circuit having one or more laser discharge structures may be affixed, directly or indirectly, to a substrate having one or more qubits. The one or more laser discharge structures may be aligned with the one or more Josephson junctions of the one or more qubits, such that the laser discharge structure emits a laser beam capable of annealing the Josephson junction in order to change the resistance of the Josephson junction, and thereby changing the frequency of the resulting qubit. The planar lightwave circuit may be attached directly to the substrate, or may be attached to an intermediate structure located between the substrate and the planar lightwave circuit. In an embodiment, an intermediate structure may include wiring, resonators, or any other structures for the qubit, and may include an optically transparent structure located between the laser discharge structure and the qubit. The laser discharge structure may ultimately be powered by an optical fiber carrying the desired wavelength and intensity of light. The optical fiber may transmit the light to a mode converter, which may then feed the light to the laser discharge structure, or alternatively may feed the light to a Mach Zehnder switch, which may select a desired path for the light to take (e.g. select which of 2 laser discharge structure to power).

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein. It is therefore intended that the present invention not be limited to the exact forms and details described and illustrated but fall within the scope of the appended claims.

What is claimed is:

1. A method for forming a multi-qubit chip, the method comprising:
    forming a plurality of qubits on a chip, wherein each qubit comprises a Josephson junction;
    annealing one or more Josephson junctions, wherein annealing is performed by one or more of a plurality of laser discharge structures sources on a planar lightwave circuit, and wherein each of the laser discharge structures is located above each qubit.

2. The method of claim 1, wherein a laser discharge structure of the plurality of laser discharge structures provides a laser emission wavelength of about 532 nm.

3. The method of claim 1, wherein a laser discharge structure of the plurality of laser discharge structures provides a laser intensity of about 0.2 W to about 2 W.

4. The method of claim 1, wherein the qubit further comprises capacitive plates located on each side of the Josephson junction, and wherein each laser discharge structure focuses a laser emission toward the Josephson junction, and wherein the laser emission avoids the capacitive plates.

5. The method of claim 1, further comprising performing annealing through an intermediate chip.

6. The method of claim 1, wherein a laser discharge structure of the plurality of laser discharge structures is a vertical grating coupler.

7. The method of claim 1, wherein a laser power source is connected to a laser emission source by a mode converter and a laser path.

8. The method of claim 7, wherein a single mode converter is attached, via a single laser path, to a single laser emission source.

9. The method of claim 7, wherein the mode converter provides power to a plurality of laser emission sources.

10. The method of claim 9, wherein the laser path is split into a first laser path for a first laser discharge structure and a second laser path for a second discharge structure source using a Mach Zehnder switch.

11. The method of claim 7, wherein the laser path is an optical fiber.

12. The method of claim 7, wherein performing annealing causes the resistance of a Josephson junction to increase, wherein the Josephson junction comprises an $Al/AlO_x/Al$ structure.

13. The method of claim 7, wherein performing annealing causes the resistance of an aluminum/aluminum oxide/aluminum Josephson junction to decrease.

* * * * *